(12) United States Patent
Chen et al.

(10) Patent No.: US 11,901,840 B2
(45) Date of Patent: Feb. 13, 2024

(54) THREE-PHASE INVERTER POWER CHIP AND PREPARATION METHOD THEREFOR

(71) Applicant: GREE ELECTRIC APPLIANCES, INC. OF ZHUHAI, Qianshan Zhuhai (CN)

(72) Inventors: Daokun Chen, Zhuhai (CN); Libo Ao, Zhuhai (CN); Bo Shi, Zhuhai (CN); Dan Zeng, Zhuhai (CN); Jun Cao, Zhuhai (CN)

(73) Assignee: GREE ELECTRIC APPLIANCES, INC. OF ZHUHAI, Zhuhai (CN)

( * ) Notice: Subject to any disclaimer, the term of this patent is extended or adjusted under 35 U.S.C. 154(b) by 257 days.

(21) Appl. No.: 17/624,930

(22) PCT Filed: Jun. 23, 2020

(86) PCT No.: PCT/CN2020/097755
§ 371 (c)(1),
(2) Date: Jan. 5, 2022

(87) PCT Pub. No.: WO2021/008317
PCT Pub. Date: Jan. 21, 2021

(65) Prior Publication Data
US 2022/0286063 A1    Sep. 8, 2022

(30) Foreign Application Priority Data
Jul. 15, 2019   (CN) .......................... 201910635287.8

(51) Int. Cl.
*H01L 29/06* (2006.01)
*H01L 23/522* (2006.01)
(Continued)

(52) U.S. Cl.
CPC ...... *H02M 7/53875* (2013.01); *H01L 23/528* (2013.01); *H01L 29/0642* (2013.01); *H02M 7/003* (2013.01)

(58) Field of Classification Search
CPC ..... H01L 23/522; H01L 23/528; H01L 29/06; H01L 29/0642
See application file for complete search history.

(56) References Cited

U.S. PATENT DOCUMENTS 9,640,617 B2 *  5/2017  Das ......................... H01L 24/49
2006/0291029 A1 * 12/2006  Lin .......................... H01L 24/12
                                                                257/E21.589
(Continued)

FOREIGN PATENT DOCUMENTS

CN    208015601 U    10/2018
CN    208739041 U    4/2019
(Continued)

OTHER PUBLICATIONS

Jemoto Y, et al., "GaN monolithic inverter IC using normally-off gate injection transistors with planar isolation on Sisubstrate," Electron Devices Meeting (IEDM), 2009 IEEE International, IEEE, Piscataway, NJ, USA, Dec. 7, 2009, 4 pages.
(Continued)

*Primary Examiner* — Gary L Laxton
(74) *Attorney, Agent, or Firm* — Christensen O'Connor Johnson Kindness PLLC (57) ABSTRACT

The present disclosure relates to a field of chip technology, and discloses a three-phase inverter power chip and a preparation method therefor. The preparation method includes: forming active areas on a substrate and an isolation area located outside the active areas; forming a source electrode, a drain electrode and a gate electrode of a transistor in each active area; forming a first bond pad, second bond pads, third bond pads and fourth bond pads in the
(Continued)

isolation area; the source electrode, the drain electrode and the gate electrode of the chip being extended to the first bond pad, the second bond pads, the third bond pads or the fourth bond pads corresponding thereto; and electrically connecting the source electrode, the drain electrode and the gate electrode of the transistor to the first bond pad, the second bond pads, the third bond pads or the fourth bond pads corresponding thereto.

20 Claims, 4 Drawing Sheets

(51) Int. Cl.
*H02M 7/5387* (2007.01)
*H01L 23/528* (2006.01)
*H02M 7/00* (2006.01)

(56) References Cited

U.S. PATENT DOCUMENTS

| | | | |
|---|---|---|---|
| 2015/0155377 A1 | 6/2015 | Kim | |
| 2015/0280611 A1* | 10/2015 | Kusumoto | H02M 1/08 257/77 |
| 2017/0221814 A1 | 8/2017 | Kinoshita et al. | |
| 2020/0035596 A1* | 1/2020 | Kao | H01L 24/05 |
| 2023/0223469 A1* | 7/2023 | Or-Bach | G11C 11/404 |

FOREIGN PATENT DOCUMENTS

| | | |
|---|---|---|
| CN | 109980955 A | 7/2019 |
| EP | 2 775 520 A2 | 9/2014 |
| EP | 2 955 755 A1 | 12/2015 |
| JP | 2006165021 A | 6/2006 |
| JP | 2011192734 A | 9/2011 |

OTHER PUBLICATIONS

Uemoto Y., et al., "Gate Injection 1,6,8 Transistor (GIT)-A Normally-Off AlGaN/GaN Power Transistor Using Conductivity Modulation," IEEE Transactions on Electron Devices, IEEE, USA, vol. 54, No. 12, Dec. 2007.

Efthymiou L., et al., "On the physical operation and optimization of the p-GaN gate in normally-off GaN HEMT devices," Applied Physics Letters, American Institute of Physics, 2 Huntington Quadrangle, Melville, NY 11747, vol. 110, No. 12, Mar. 21, 2017.

Extended European Search Report dated Jun. 21, 2022, issued in corresponding European Application No. EP 20 84 0520, filed Jun. 23, 2020, 15 pages.

International Search Report dated Sep. 18, 2020, issued in corresponding International Application No. PCT/CN2020/097755, filed Jun. 23, 2020, 2 pages.

* cited by examiner

THREE-PHASE INVERTER POWER CHIP AND PREPARATION METHOD THEREFOR

RELATED APPLICATION

The present application claims the priority of Chinese Patent Application No. 201910635287.8, filed on Jul. 15, 2019, with the title of "THREE-PHASE INVERTER POWER CHIP AND PREPARATION METHOD THEREFOR", the entire content of which is incorporated herein by reference. This application is a national phase of international patent application PCT/CN2020/097755, entitled "THREE-PHASE INVERTER POWER CHIP AND PREPARATION METHOD THEREFOR" filed on Jun. 23, 2020, the content of which is also hereby incorporated by reference.

TECHNICAL FIELD

The present disclosure relates to the technical field of chips, in particular to a three-phase inverter power chip and a preparation method therefor.

BACKGROUND

Figure 1:
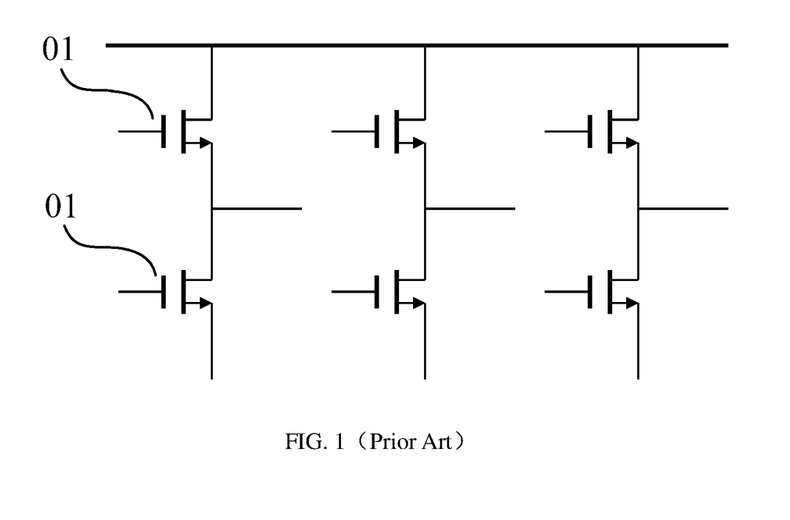
FIG. 1 is a view showing a three-phase inverter bridge circuit in the related technology.

Three-phase inverter bridges are widely used in power electronic devices such as frequency converters, motor driving systems, inverters, etc. The circuit structure view of a three-phase inverter bridge is shown in FIG. 1. The three-phase inverter bridge includes six Gallium nitride (GaN) high electron mobility transistors (HEMT). Where drain electrodes of three high-side GaN HEMTs are connected together, and for each bridge arm, source electrodes of the high-side GaN HEMTs and drain electrodes of the low-side GaN HEMTs are connected together. The GaN HEMT has excellent characteristics of high voltage, high frequency, low conduction loss and zero reverse recovery. The use of GaN HEMTs in the three-phase inverter bridge may reduce the number of components in the three-phase inverter bridge, reduce the difficulty of packaging, and moreover, the working frequency may be increased, the output waveform is improved, and the inverter efficiency is increased, etc. However, the six GaN HEMTs chips in the three-phase inverter bridge are electrically connected by bond wires, which causes a low integration, a complex package, and excessive bond wires will introduce excessive parasitic inductance, thus affecting the working efficiency of the circuit.

SUMMARY

The present disclosure provides a three-phase inverter power chip and a preparation method therefor. The three-phase inverter power chip prepared by the preparation method for the three-phase inverter power chip improves an integration and reduces parasitic inductance between the chips, thereby improving the working efficiency of the circuit.

In order to achieve the above objectives, the present disclosure provides the following technical solutions.

A method for preparing a three-phase inverter power chip includes:

forming a channel layer and a potential energy barrier layer on a side surface of a substrate in sequence; forming three active area pairs on the channel layer and the potential energy barrier layer along a first direction by an isolation process; each of the three active area pairs comprising two active areas, wherein, among the two active areas included in each of the three active area pairs, one active area is configured to form a high-side transistor therein, and the other active area is configured to form a low-side transistor therein; forming an isolation area outside the active areas, and at a side of the channel layer and of the potential energy barrier layer away from the substrate;

forming a chip device layer on the potential energy barrier layer; each portion of the chip device layer corresponding to each of the active areas comprising a source electrode, a drain electrode, and a gate electrode, and another portion of the chip device layer corresponding to the isolation area comprising a first bond pad, second bond pads configured to correspond one-to-one with the three active area pairs, third bond pads configured to correspond one-to-one with the three active area pairs, and fourth bond pads configured to correspond one-to-one with the active areas; in each group of the three active area pairs, the first bond pad, the second bond pads, the third bond pads, and the fourth bond pads, which correspond to each other, electrically connecting the drain electrode arranged in each of the active areas, configured to form the high-side transistor, to the first bond pad, electrically connecting the source electrode arranged in each of the active areas, configured to form the high-side transistor, to each of the second bond pads, respectively, electrically connecting the drain electrode arranged in each of the active areas, configured to form the low-side transistor, to each of the second bond pads, respectively, electrically connecting the source electrode arranged in each of the active areas, configured to form the low-side transistor, to each of the third bond pads, respectively, and electrically connecting the gate electrode arranged in each of the active areas to each of the fourth bond pads, respectively;

forming a dielectric passivation layer on the chip device layer; and etching the dielectric passivation layer, and exposing the first bond pad, the second bond pads, the third bond pads, and the fourth bond pads.

In the preparation method for the three-phase inverter power chip described above, the active area and the isolation area are formed on the substrate, and the transistors are formed in each of the active areas, respectively. The first bond pad, the second bond pads 11, the third bond pads, and the fourth bond pads are formed in the isolation area. During the preparation process of the transistor, the source electrode, the drain electrode and the gate electrode of the transistor are all extended to the first bond pad, the second bond pad, the third bond pad, or the fourth bond pad, which corresponds to the transistor, and the source electrode, the drain electrode and the gate electrode of the transistor are electrically connected to the first bond pad, the second bond pad, the third bond pad, or the fourth bond pad corresponding thereto, thereby forming the three-phase inverter power chip. In the preparation method for the three-phase inverter power chip, the six transistors configured to form the three-phase inverter bridge are directly prepared on the substrate, thereby achieving a high integration, reducing the difficulty of packaging the three-phase inverter power chip. Moreover, by means of the layout during the preparation, the source electrode, the drain electrode and the gate electrode of the transistor are all extended to and connected electrically to the first bond pad, the second bond pad, the third bond pad, or the fourth bond pad corresponding thereto, which replaces the connection mode of connecting the transistors by bond wires in the related technology, thereby avoiding the increase of parasitic inductance due to excessive bond wires, reducing the influence of parasitic parameters on the inverter efficiency, and improving the working efficiency of the circuit.

In some embodiments, the forming a chip device layer on the potential energy barrier layer includes:

forming an ohmic metal layer on a side of the potential energy barrier layer away from the substrate, and the source electrode and the drain electrode are formed by a patterning process;

forming a gate electrode metal layer on the side of the potential energy barrier layer away from the substrate, and forming the gate electrode by the patterning process;

forming a first dielectric layer on a side of the source electrode, the drain electrode and the gate electrode, the side being away from the substrate, and forming first through-holes at portions of the first dielectric layer, the portions of the first dielectric layer corresponding to the source electrode, the drain electrode, and the gate electrode;

forming a first metal layer on a side of the first dielectric layer away from the substrate; portions of the first metal layer, which are opposite to the first through-holes, sinking into the first through-holes; forming a first metal part of the first bond pad, a first metal part of the second bond pad, a first metal part of the third bond pad, and a first metal part of the fourth bond pad in the isolation area by the first metal layer through the patterning process; forming a source electrode first metal part at a position opposite to the source electrode, to connect the source electrode and the first metal part of the second bond pad or the first metal part of the third bond pad; forming a drain electrode first metal part at a position opposite to the drain electrode, to connect the drain electrode and the first metal part of the first bond pad or the first metal part of the second bond pad; forming a gate electrode first metal part at a position opposite to the gate electrode;

forming a second dielectric layer on a side of the first metal layer away from the substrate; forming second through-holes at portions of the second dielectric layer, wherein the portions of the second dielectric layer correspond to the first metal part of the first bond pad, the first metal part of the second bond pad, the first metal part of the third bond pad, the first metal part of the fourth bond pad, the source electrode, the drain electrode, and the gate electrode;

forming a second metal layer on a side of the second dielectric layer away from the substrate; portions of the second metal layer, which are opposite to the second through-holes, sinking into the second through-holes; forming a second metal part of the first bond pad, a second metal part of the second bond pad, a second metal part of the third bond pad, and a second metal part of the fourth bond pad in the isolation area by the second metal layer through the patterning process; forming a source electrode second metal part at a position opposite to the source electrode; forming a drain electrode second metal part at a position opposite to the drain electrode; and forming a gate electrode second metal part at a position opposite to the gate electrode, to connect the gate electrode first metal part and the second metal part of the fourth bond pad.

In some embodiments, the forming a chip device layer on the potential energy barrier layer includes:

forming an ohmic metal layer on a side of the potential energy barrier layer away from the substrate, and forming the source electrode and the drain electrode by a patterning process;

forming a gate electrode metal layer on the side of the potential energy barrier layer away from the substrate, and forming the gate electrode by the patterning process;

forming a first dielectric layer on a side of the source electrode, the drain electrode and the gate electrode away from substrate; forming first through-holes at portions of the first dielectric layer, the portions of the first dielectric layer corresponding to the source electrode, the drain electrode and the gate electrode;

forming a first metal layer on a side of the first dielectric layer away from the substrate; portions of the first metal layer, which are opposite to the first through-holes, sinking into the first through-holes; forming a first metal part of the first bond pad, a first metal part of the second bond pad, a first metal part of the third bond pad, and a first metal part of the fourth bond pad in the isolation area by the first metal layer through the patterning process; forming a source electrode first metal part at a position opposite to the source electrode; forming a drain electrode first metal part at a position opposite to the drain electrode; and forming a gate electrode first metal part at a position opposite to the gate electrode, to connect the gate electrode and the first metal part of the fourth bond pad;

forming a second dielectric layer on a side of the first metal layer away from the substrate; forming second through-holes at portions of the second dielectric layer, wherein the portions of the second dielectric layer correspond to the first metal part of the first bond pad, the first metal part of the second bond pad, the first metal part of the third bond pad, the first metal part of the fourth bond pad, the source electrode, the drain electrode and the gate electrode;

forming a second metal layer on a side of the second dielectric layer away from the substrate; portions of the second metal layer, which are opposite to the second through-holes, sinking into the second through-holes, respectively; forming a second metal part of the first bond pad, a second metal part of the second bond pad, a second metal part of the third bond pad and a second metal part of the fourth bond pad in the isolation area by the second metal layer through the patterning process; forming a source electrode second metal part at a position opposite to the source electrode, to connect the source electrode first metal part and the second metal part of the second bond pad or the second metal part of the third bond pad; forming a drain electrode second metal part at a position opposite to the drain electrode, to connect the drain electrode first metal part and the second metal part of the first bond pad or the second metal part of the second bond pad; and forming a gate electrode second metal part at a position opposite to the gate electrode.

In some embodiments, the isolation process includes a mesa etching process, and an etching depth is 100 nm to 500 nm.

In some embodiments, the isolation process includes an ion implantation process, and an ion implantation depth is 100 nm to 500 nm.

The present disclosure further provides a three-phase inverter power chip, including:
  a substrate;
  a channel layer and a potential energy barrier layer formed on a side surface of the substrate in sequence, three active area pairs being formed on the channel layer and the potential energy barrier layer along a first direction, each of the three active area pairs comprising two active areas arranged in a direction perpendicular to the first direction, wherein, among the two active areas in each of the three active area pairs, one active area is configured to form a high-side transistor therein, and the other active area is configured to form a low-side transistor therein; an isolation region, formed outside the active areas and formed at a side of the channel layer and the potential energy barrier layer away from the substrate;
  a chip device layer formed on a side of the potential energy barrier layer away from the channel layer, wherein: each portion of the chip device layer, which is corresponding to each of the active areas, includes a source electrode, a drain electrode, and a gate electrode; another portion of the chip device layer corresponding to the isolation area includes a first bond pad, second bond pads configured to correspond one-to-one with the active area pairs, third bond pads configured to correspond one-to-one with the active area pairs, and fourth bond pads configured to correspond one-to-one with the active areas; in the active area pairs, the drain electrodes in the active areas configured to form high-side transistors respectively are electrically connected to the first bond pad; in the active area pairs, the source electrodes arranged in the active areas configured to form high-side transistors are electrically connected to the second bond pads corresponding one-to-one with the active area pairs, respectively; in the active area pairs, the drain electrodes arranged in the active areas configured to form low-side transistors are electrically connected to the second bond pads corresponding one-to-one with the active area pairs, respectively; in each the active area pairs, the source electrodes arranged in the active area configured to form the low-side transistors are electrically connected to the third bond pads corresponding one-to-one with the active area pairs, respectively; and in the active area pairs, the gate electrodes arranged in the active areas are electrically connected to the fourth bond pads corresponding one-to-one with the active areas, respectively; and
  the dielectric passivation layer formed on a side of the chip device layer away from the substrate, wherein portions of the dielectric passivation layer, which are opposite to the first bond pad, the second bond pads, the third bond pads, and the fourth bond pads, are respectively etched to expose the first bond pad, the second bond pads, the third bond pads and the fourth bond pads.

In some embodiments, materials of the first dielectric layer, the second dielectric layer and the dielectric passivation layer are SiN, $SiO_2$, or a combination thereof.

According to another aspect of the present disclosure, a three-phase inverter power chip is provided. The three-phase inverter power chip includes: a substrate; a channel layer provided on one side surface of the substrate; a plurality of active areas, each of the plurality of active areas comprising a potential energy barrier layer and a chip device layer sequentially arranged on the channel layer, wherein: the chip device layer includes source electrodes, drain electrodes, gate electrodes and a metal interconnection layer; the metal interconnection layer has a source electrode interconnection metal part corresponding to each of the source electrodes, a drain electrode interconnection metal part corresponding to each of the drain electrodes, and a gate electrode interconnection metal part corresponding to each of the gate electrodes; the plurality of active areas form three active area pairs arranged along a first direction; each of the three active area pairs includes two active areas; in each of the active area pairs, one active area is configured to form a high-side transistor therein and is named as a first active area, and the other active area is configured to form a low-side transistor therein and is named as a second active area; an isolation area, arranged between the active areas to separate the active areas from each other, and extending from the channel layer towards a side away from the substrate, wherein: the isolation area is provided with a first bond pad, second bond pads corresponding one-to-one with the three active area pairs, third bond pads corresponding one-to-one with the three active area pairs, and fourth bond pads corresponding one-to-one with the active areas; the drain electrodes in the first active area are electrically connected to the first bond pad by respective drain electrode interconnection metal parts thereof; the source electrodes in the first active area are electrically connected to corresponding the second bond pads by respective source electrode interconnection metal parts thereof; the drain electrodes in the second active area are electrically connected to corresponding the second bond pads by respective drain electrode interconnection metal parts thereof; the source electrodes in the second active area are electrically connected to corresponding the third bond pads by respective source electrode interconnection metal parts thereof; and the gate electrodes in the active areas are electrically connected to corresponding the fourth bond pads by respective gate electrode interconnection metal parts thereof.

Further, the first bond pad, the second bond pad, the third bond pad, and the fourth bond pad each include a bond pad interconnection metal part; each drain electrode in the first active area is electrically connected to the bond pad interconnection metal part of the first bond pad by a respective drain electrode interconnection metal part; each source electrode in the first active area is electrically connected to the bond pad interconnection metal part of the second bond pad by a respective source electrode interconnection metal part; each drain electrode in the second active area is electrically connected to the bond pad interconnection metal part of the second bond pad by the respective drain electrode interconnection metal part; each source electrode in the second active area is electrically connected to the bond pad interconnection metal part of the third bond pad by the respective source electrode interconnection metal part; and a gate electrode in each active area is electrically connected to the bond pad interconnection metal part of the fourth bond pad by the respective gate electrode interconnection metal part.

Further, the first bond pad, the second bond pad, the third bond pad, and the fourth bond pad each further include a bond pad part, and the bond pad part is arranged on a top surface of a corresponding bond pad interconnection metal part.

Further, a P-type GaN layer is provided between each gate electrode in the chip device layer and the potential energy barrier layer. In some embodiments, a p-type doping concentration in the P-type GaN layer is 1e16 cm-3 to 1e20 cm-3. In some embodiments, a thickness of the P-type GaN layer is 50 nm to 200 nm, and the potential energy barrier layer is an AlGaN layer. In some embodiments, the potential energy barrier layer contains Al with a mass content of 5% to 30%. In some embodiments, a thickness of the potential energy barrier layer is 10 nm to 30 nm, and the channel layer is a GaN layer. In some embodiments, a thickness of the channel layer is 50 nm to 500 nm. In some embodiments, an AlN layer is provided between the potential energy barrier layer and the channel layer. In some embodiments, a thickness of the AN layer is 1 nm to 5 nm. In some embodiments, a buffer layer is provided between the channel layer and the substrate. In some embodiments, a material of the buffer layer is one or more of AlGaN, AN, and GaN. In some embodiments, a thickness of the buffer layer is 1 μm to 7 μm.

Further, the metal interconnection layer has the source electrode interconnection metal part, the drain electrode interconnection metal part, the gate electrode interconnection metal part, and a dielectric part; the dielectric part is configured to isolate the source electrode interconnection metal part, the drain electrode interconnection metal part, and the gate electrode interconnection metal part from each other; and a material of the dielectric part is SiN, $SiO_2$ or a combination thereof.

The six transistors configured to form the three-phase inverter bridge are directly fabricated
on one substrate, which achieves the high integration and reduces the difficulty of packaging the three-phase inverter power chip, thereby reducing the use of excessive bond wires, avoiding the increase of parasitic inductance due to the excessive bond wires, reducing the influence of the parasitic parameters on the inverter efficiency effectively, and further improving the working efficiency of the circuit.

In addition, the interconnection metal structure enables the source electrodes, the drain electrodes and the gate electrodes of the transistors to extend to and be electrically connected with the first bond pad, the second bond pads, the third bond pads or the fourth bond pads corresponding thereto, which replaces the connection mode of connecting the transistors by bond wires in the related technology, thus avoiding the increase of parasitic inductance due to excessive bond wires, reducing the influence of the parasitic parameters on the inverter efficiency effectively, and further improving the working efficiency of the circuit.

BRIEF DESCRIPTION OF THE DRAWINGS

The accompanying drawings constituting a part of the present application are used to provide a further understanding of the present disclosure. The exemplary embodiments and descriptions of the present disclosure are used to explain the present disclosure, and do not constitute an improper limitation of the present disclosure. In the accompanying drawings.

Where, the accompanying drawings include following reference signs:
01—Gallium Nitride High Electron Mobility Transistor; 1—substrate; 2—channel layer; 3—active area pair; 31—active area; 4—potential energy barrier layer; 5—source electrode; 6—drain electrode; 7—source electrode first metal part; 8—drain electrode first metal part; 9—gate electrode; 10—first bond pad; 11—second bond pad; 12—third bond pad; 13—fourth bond pad; 14—gate electrode second metal part; 15—dielectric passivation layer; 16—buffer layer; 17—isolation area; 18—P-type semiconductor layer; 19—first dielectric layer; 20—second dielectric layer; 21—source electrode second metal part; 22—drain electrode second metal part; 23—gate electrode first metal part.

DETAILED DESCRIPTION OF THE EMBODIMENTS

The technical solutions in the embodiments of the present disclosure will be clearly and completely described hereafter by combining with the accompanying drawings in the embodiments of the present disclosure. Obviously, the described embodiments are only a part of the embodiments of the present disclosure, rather than all the embodiments. Based on the embodiments of the present disclosure, all other embodiments obtained by those of ordinary skill in the art without creative work shall fall within the protection scope of the present disclosure.

Please refer to FIGS. 2 to 7, the present disclosure provides a preparation method for a three-phase inverter power chip including steps as follows.

Figure 2:
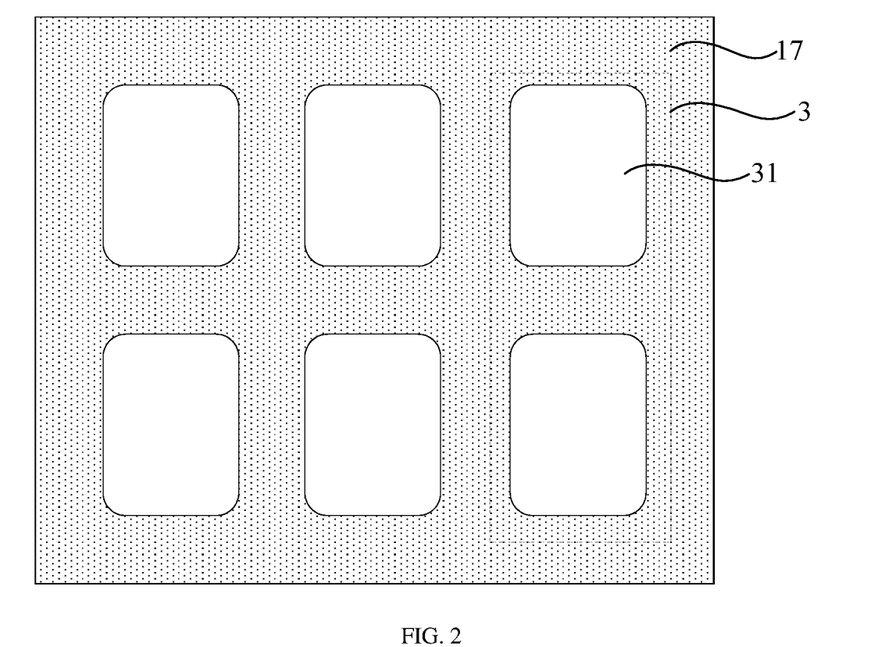
FIG. 2 is a schematic view illustrating an active area and an isolation area of a three-phase inverter power chip provided by the present disclosure.
Figure 3:
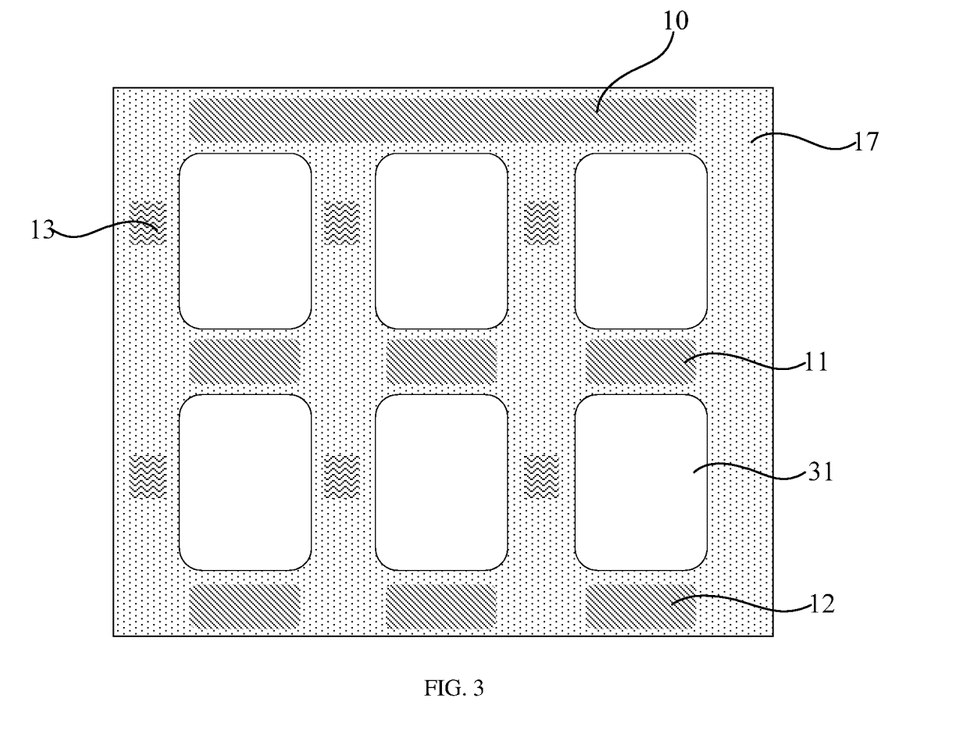
FIG. 3 is a schematic view illustrating positions of a first bond pad, a second bond pad, a third bond pad and a fourth bond pad of the three-phase inverter power chip provided by the present disclosure.
Figure 4:
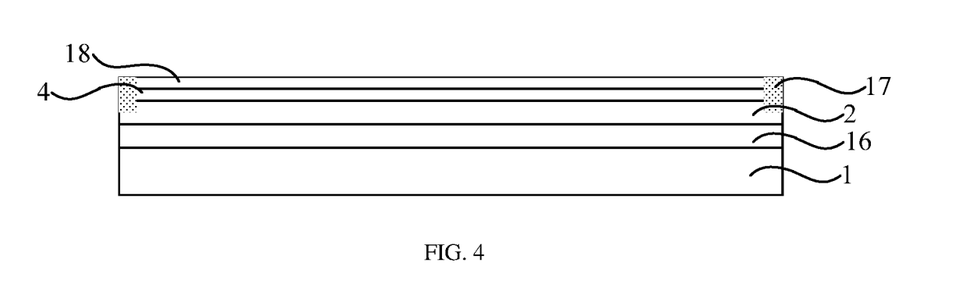
FIGS. 4 to 7 are schematic views showing a preparation process of the three-phase inverter power chip provided by the present disclosure.

As shown in FIG. 2, FIG. 3 and FIG. 4, a channel layer 2 and a potential energy barrier layer 4 are formed on a side surface of the substrate 1 in sequence, and three active area pairs 3 are formed on the channel layer 2 and the potential energy barrier layer 4 along the first direction by an isolation process. Each active area pair 3 includes two active areas 31. Among the two active areas 31 included in each active area pair 3, one active area 31 is configured to form the high-side transistor therein, and the other active area 31 is configured to form the low-side transistor therein. An isolation area 17 is formed outside the active areas 31, and formed at a side of the channel layer 2 and of the potential energy barrier layer 4, which is away from the substrate 1.

Figure 5:
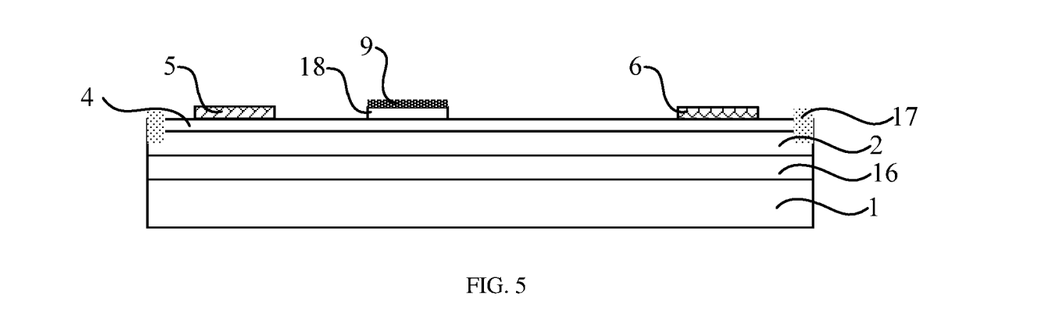
Figure 6:
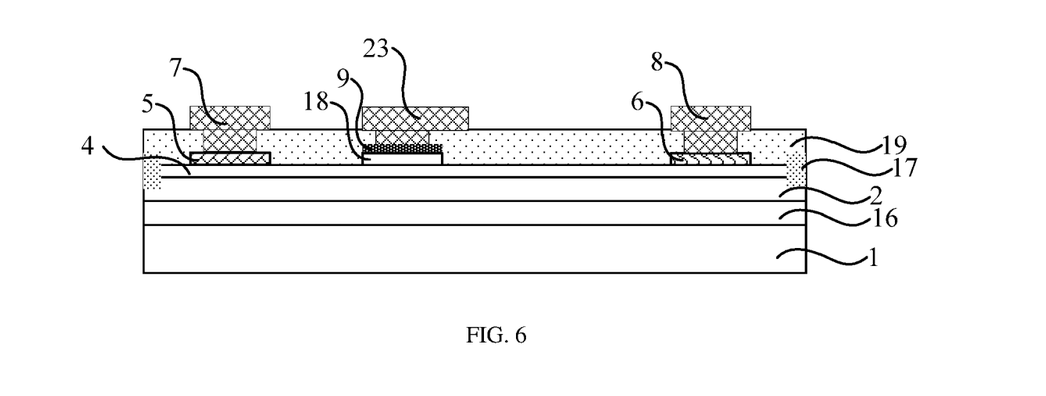
Figure 7:
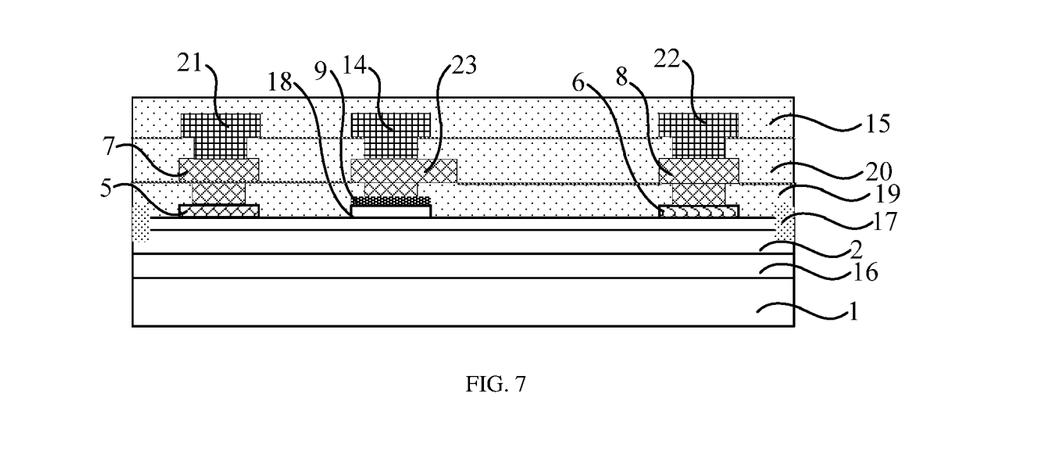

As shown in FIG. 5, FIG. 6 and FIG. 7, a chip device layer is formed on the potential energy barrier layer 4. A portion of the chip device layer corresponding to each active area 31 includes a source electrode 5, a drain electrode 6 and a gate electrode 9. Another portion of the chip device layer corresponding to the isolation area 17 includes a first bond pad 10, second bond pads 11 configured to correspond one-to-one with the active area pairs 3, third bond pads 12 configured to correspond one-to-one with the active area pairs 3, and fourth bond pads 13 configured to correspond one-to-one with the active areas 31. In each group of the active area pairs 3, the first bond pad 10, the second bond pads 11, the third bond pads 12, and the fourth bond pads 13, which correspond to each other, the drain electrodes 6 arranged in the active areas 31 configured to form the high-side transistors respectively are electrically connected to the first bond pad 10. The source electrodes 5 arranged in the active areas 31 configured to form the high-side transistors are electrically connected to the second bond pads 11, respectively. The drain electrodes 6 arranged in the active areas 31 configured to form the low-side transistors are electrically connected to the second bond pads 11, respectively, the source electrodes 5 arranged in the active areas 31 configured to form the low-side transistors are electrically connected to the third bond pads 12, respectively, and the gate electrodes 9 arranged in the active areas 31 are electrically connected to the fourth bond pads 13, respectively.

A dielectric passivation layer 15 is formed on the chip device layer.

The dielectric passivation layer 15 is etched to expose the first bond pad 10, the second bond pads 11, the third bond pads 12, and the fourth bond pads 13.

In the preparation method for the three-phase inverter power chip described above, the active area 31 and the isolation area 17 are formed on the substrate 1, and the transistors are formed in each of the active areas 31, respectively. The first bond pad 10, the second bond pads 11, the third bond pads 12, and the fourth bond pads 13 are formed in the isolation area 17. During the preparation process of the transistor, the source electrode 5, the drain electrode 6 and the gate electrode 9 of the transistor are all extended to the first bond pad 10, the second bond pad 11, the third bond pad 12, or the fourth bond pad 13, which corresponds to the transistor, and the source electrode 5, the drain electrode 6 and the gate electrode 9 of the transistor are electrically connected to the first bond pad 10, the second bond pad 11, the third bond pad 12, or the fourth bond pad 13 corresponding thereto, thereby forming the three-phase inverter power chip. In the preparation method for the three-phase inverter power chip, the six transistors configured to form the three-phase inverter bridge are directly prepared on the substrate 1, thereby achieving a high integration, reducing the difficulty of packaging the three-phase inverter power chip. Moreover, by means of the layout during the preparation, the source electrode 5, the drain electrode 6 and the gate electrode 9 of the transistor are all extended to and connected electrically to the first bond pad 10, the second bond pad 11, the third bond pad 12, or the fourth bond pad 13 corresponding thereto, which replaces the connection mode of connecting the transistors by bond wires in the related technology, thereby avoiding the increase of parasitic inductance due to excessive bond wires, reducing the influence of parasitic parameters on the inverter efficiency, and improving the working efficiency of the circuit.

As shown in FIGS. 2 and 3, the positions of the first bond pad 10, the second bond pads 11, the third bond pads 12 and the fourth bond pads 13 in the isolation area 17 may be arranged in a plurality of ways. In an embodiment, the first bond pad 10 is formed at a side of the active areas 31 configured to form the high-side transistors, which is far away from the active area 31 configured to form the low-side transistors, and the second bond pads 11 each are formed between the two active areas 31 of each corresponding active area pair 3. The third bond pads 12 each are formed at a side of the active areas 31 configured to form the low-side transistors, which is far away from the active areas 31 configured to form the high-side transistors. The fourth bond pads 13 are formed at sides of the active areas 31 and correspond one-to-one with the active areas 31. This arrangement can make the layout of the transistors simpler.

Specifically, as shown in FIG. 5, FIG. 6 and FIG. 7, the chip device layer is formed on the potential energy barrier layer 4. The first embodiment includes following steps.

An ohmic metal layer is formed on the potential energy barrier layer 4 away from the substrate 1, and the source electrode 5 and the drain electrode 6 are formed by a patterning process.

A gate electrode metal layer is formed on the side of the potential energy barrier layer 4 away from the substrate 1, and the gate electrode 9 is formed by a patterning process.

A first dielectric layer 19 is formed on a side of the source electrode 5, the drain electrode 6 and the gate electrode 9, which is away from the substrate 1, and first through-holes are formed at portions of the first dielectric layer 19, which are corresponding to the source electrode 5, the drain electrode 6, and the gate electrode 9.

A first metal layer is formed on a side of the first dielectric layer 19 away from the substrate 1. The portions of the first metal layer, which are opposite to the first through-holes, sink into the first through-holes. The first metal layer forms a first metal part of the first bond pad, a first metal part of the second bond pad, a first metal part of the third bond pad, and a first metal part of the fourth bond pad in the isolation area 17 by means of a patterning process. A source electrode first metal part 7 is formed at a position opposite to the source electrode 5 and is configured to connect the source electrode 5 and the first metal part of the second bond pad or the first metal part of the third bond pad. A drain electrode first metal part 8 is formed at a position opposite to the drain electrode 6 and is configured to connect the drain electrode 6 and the first metal part of the first bond pad or the first metal part of the second bond pad. A gate electrode first metal part 23 is formed at a position opposite to the gate electrode 9.

The second dielectric layer 20 is formed on a side of the first metal layer away from the substrate 1, and second through-holes are formed at portions of the second dielectric layer 20, which correspond to the first metal part of the first bond pad, the first metal part of the second bond pad, the first metal part of the third bond pad, the first metal part of the fourth bond pad, the source electrode 5, the drain electrode 6, and the gate electrode 9.

A second metal layer is formed on a side of the second dielectric layer 20 away from the substrate 1. The portions of the second metal layer, which are opposite to the second through-holes, sink into the second through-holes. The second metal layer forms a second metal part of the first bond pad, a second metal part of the second bond pad, a second metal part of the third bond pad, and a second metal part of the fourth bond pad in the isolation area 17 by a patterning process. A source electrode second metal part 21 is formed at a position opposite to the source electrode 5, a drain electrode second metal part 22 is formed at a position opposite to the drain electrode 6, and a gate electrode second metal part 14 is formed at a position opposite to the gate electrode 9 and is configured to connect the gate electrode first metal part 23 and the second metal part of the fourth bond pad.

In the first embodiment, it is implemented in the first metal layer that the source electrode 5 and the drain electrode 6 are electrically connected to the first bond pad 10, the second bond pad 11, or the third bond pad 12. The specific mode is as follows. The first metal layer is deposited and patterned to form the first metal part of the first bond pad, the first metal part of the second bond pad, the first metal part of the third bond pad, the source electrode first metal part, and the drain electrode first metal part. The source electrode 5 in the first active area is connected to the first metal part of the second bond pad, and the source electrode 5 in the second active area is connected to the first metal part of the third bond pad through their respective source electrode first metal parts 7, respectively. The drain electrode 6 in the first active area is connected to the first metal part of the first bond pad, the drain electrode 6 in the second active area is connected to the first metal part of the second bond pad through their respective drain electrode first metal parts 8, respectively. The first metal layer forms the gate electrode first metal part 23 at the position corresponding to the gate electrode 9. The gate electrode first metal part 23, on the one hand, takes effects of connecting, on the other hand, functions as a spacer and avoids a height difference, and also functions as a gate electrode metal field plate. The first metal layer is deposited and patterned to form the first metal part of the fourth bond pad. The gate electrode first metal part 23 and the first metal part of the fourth bond pad are electrically connected in the second metal layer. The specific mode is as follows. The second metal layer is deposited and patterned to form the second metal part of the fourth bond pad, forms the gate electrode second metal part 14 at the position opposite to the gate electrode first metal part 23. The gate electrode first metal part 23 and the second metal part of the fourth bond pad are electrically connected through the gate electrode second metal part 14.

Specifically, as shown in FIG. 5, FIG. 6 and FIG. 7, the chip device layer is formed on the potential energy barrier layer 4. The second embodiment includes following steps.

An ohmic metal layer is formed on a side of the potential energy barrier layer 4 away from the substrate 1, and the source electrode 5 and the drain electrode 6 are formed by a patterning process.

A gate electrode metal layer is formed on the side of the potential energy barrier layer 4 away from the substrate, and the gate electrode 9 is formed by a patterning process.

A first dielectric layer 19 is formed on a side of the source electrode 5, the drain electrode 6 and the gate electrode 9, which is away from substrate 1, and first through-holes are formed at portions of the first dielectric layer 19, which correspond to the source electrode 5, the drain electrode 6 and the gate electrode 9.

A first metal layer is formed on a side of the first dielectric layer 19 away from the substrate 1. The portions of the first metal layer opposite to the first through-holes sink into the first through-holes. The first metal layer forms a first metal part of the first bond pad, a first metal part of the second bond pad, a first metal part of the third bond pad and a first metal part of the fourth bond pad in the isolation area 17 by a patterning process. The source electrode first metal part 7 is formed at a position opposite to the source electrode 5, the drain electrode first metal part 8 is formed at the position opposite to the drain electrode 6, and a gate electrode first metal part 23 is formed at the position opposite to the gate electrode 9 and is configured to connect the gate electrode 9 and the first metal part of the fourth bond pad.

The second dielectric layer 20 is formed on the side of the first metal layer away from the substrate 1, and the second through-holes are formed at portions of the second dielectric layer 20, which correspond to the first metal part of the first bond pad, the first metal part of the second bond pad, the first metal part of the third bond pad, the first metal part of the fourth bond pad, the source electrode 5, the drain electrode 6 and the gate electrode 9.

A second metal layer is formed on a side of the second dielectric layer 20 away from the substrate 1. The portions of the second metal layer, which are opposite to the second through-holes, sink into the second through-holes, respectively. The second metal layer forms a second metal part of the first bond pad, a second metal part of the second bond pad, a second metal part of the third bond pad and a second metal part of the fourth bond pad in the isolation area 17 by a patterning process. A source electrode second metal part 21 is formed at a position opposite to the source electrode 5 and is configured to connect the source electrode first metal part 7 and the second metal part of the second bond pad or the second metal part of the third bond pad. A drain electrode second metal part 22 is form at the position opposite to the drain electrode 6 and is configured to connect the drain electrode first metal part 8 and the second metal part of the first bond pad or the second metal part of the second bond pad. A gate electrode second metal part 14 is formed at the position opposite to the gate electrode 9.

In the second embodiment, the gate electrode 9 is electrically connected to the fourth bond pad 13 in the first metal layer. The specific method is as follows. The first metal layer is deposited and patterned to form the gate electrode first metal part 23 and the first metal part of the fourth bond pad. The gate electrode 9 is electrically connected to the first metal part of the fourth bond pad by the gate electrode first metal part 23. The first metal layer is deposited and patterned to form the source electrode first metal part 7 and the drain electrode first metal part 8, the first metal part of the first bond pad, the first metal part of the second bond pad, and the first metal part of the third bond pad. By depositing and patterning the second metal layer, the gate electrode second metal part 14 is formed at a position opposite to the gate electrode first metal part 23, the second metal part of the fourth bond pad is formed at a position opposite to the first metal part of the fourth bond pad, the source electrode second metal part 21 is formed at a position opposite to the source electrode first metal part 7, and the drain electrode second metal part 22 is formed at a position opposite to the drain electrode first metal part 8, the second metal part of the first bond pad is formed at a position opposite to the first metal part of the first bond pad, the second metal part of the second bond pad is formed at a position opposite to the first metal part of the second bond pad, and the second metal part of the third bond pad is formed at a position opposite to the first metal part of the third bond pad. The source electrode and the drain electrode are electrically connected with the first bond pad, the second bond pad or the third bond pad in the second metal layer. The source electrode first metal part 7 is connected to the second metal part of the second bond pad or the second metal part of the third bond pad by the source electrode second metal part 21, and the drain electrode first metal part 8 is connected to the second metal part of the first bond pad or the second metal part of the second bond pad through the drain electrode second metal part 22.

Specifically, the isolation process includes a mesa etching process, and the etching depth is 100 nm to 500 nm.

Specifically, the isolation process includes an ion implantation process, and the ion implantation depth is 100 nm to 500 nm.

The etching depth and the ion implantation depth described above exceed the depth of the two-dimensional electron gas channel in the three-phase inverter power chip, so as to electrically isolate different active areas.

The present disclosure also provides a three-phase inverter power chip, including a substrate 1.

The channel layer 2 and the potential energy barrier layer 4 are formed on a side surface of the substrate 1 in sequence. Three active area pairs 3 are formed on the channel layer 2 and the potential energy barrier layer 4 along the first direction. Each of the active area pairs 3 includes two active areas. Among the two active areas 31 included in each active area pair 3, one active area 31 is configured to form the high-side transistor therein, and the other active area 31 is configured to form the low-side transistor therein. The isolation region 17 is formed outside the active area 31, and formed at a side of the channel layer 2 and the potential energy barrier layer 4, which is away from the substrate.

The chip device layer is formed on the side of the potential energy barrier layer 4 away from the channel layer 2. A portion of the chip device layer corresponding to each active area 31 includes a source electrode 5, a drain electrode 6, and a gate electrode 9. Another portion of the chip device layer corresponding to the isolation area 17 includes a first bond pad 10, second bond pads 11 configured to correspond one-to-one with the active area pairs 3, third bond pads 12 configured to correspond one-to-one with the active area pairs 3, and fourth bond pads 13 configured to correspond one-to-one with the active areas 31. In the active area pairs 3, the drain electrodes 6 in the active areas 31 configured to form the high-side transistors respectively are electrically connected to the first bond pad 10. In the active area pairs 3, the source electrodes 5 arranged in the active areas 31 configured to form the high-side transistors are electrically connected to the second bond pads 11 corresponding one-to-one with the active area pairs 3, respectively. In the active area pairs 3, the drain electrodes 6 arranged in the active areas 31 configured to form the low-side transistors are electrically connected to the second bond pads 11 corresponding one-to-one with the active area pairs 3, respectively. In the active area pairs 3, the source electrodes 5 arranged in the active area 31 configured to form the low-side transistors are electrically connected to the third bond pads 12 corresponding one-to-one with the active area pairs 3, respectively. And in the active area pairs 3, the gate electrodes 9 arranged in active areas 31 are electrically connected to the fourth bond pads 13 corresponding one-to-one with the active areas 31, respectively.

The dielectric passivation layer 15 is formed on the side of the chip device layer away from the substrate 1. The portions of the dielectric passivation layer 15, which are opposite to the first bond pad 10, the second bond pads 11, the third bond pads 12, and the fourth bond pads 13, are respectively etched to expose the first bond pad 10, the second bond pads 11, the third bond pads 12 and the fourth bond pads 13.

The three-phase inverter power chip above includes the substrate 1 and the transistors formed in the active areas on the substrate 1, and includes the first bond pad 10, the second bond pads 11, the third bond pads 12, and the fourth bond pads 13, which are formed in the isolation area 17 on the substrate 1 and are configured to realize the electrical connections between the electrodes of the transistors. The three-phase inverter power chip described above realizes the objective that the six transistors configured to form the three-phase inverter bridge are directly fabricated on the substrate 1, thus achieving a high integration and reducing the difficulty of packaging the three-phase inverter power chip. Moreover, the source electrode 5, the drain electrode 6 and the gate electrode 9 of each transistor in the three-phase inverter power chip are all extended to and electrically connected to the first bond pad 10, the second bond pad 11, the third bond pad 12 and the fourth bond pad 13 corresponding thereto. Compared with the connection mode that the transistors are connected by bond wires in the related technology, the present application avoids the increase of the parasitic inductance due to excessive bond wires, reduces the influence of parasitic parameters on the inverter efficiency, and improves the working efficiency of the circuit.

In the present disclosure, the high-side transistors and the low-side transistors are all Gallium Nitride High Electron Mobility Transistors (GaN HEMTs). The GaN HEMT has excellent characteristics of a high voltage, a high frequency, a low conduction loss and a zero reverse recovery. Using the GaN HEMT in the three-phase inverter bridge may reduce the number of components and reduce the difficulty of packaging, and moreover, may increase the operating frequency, improve the output waveform, and improve the inverter efficiency. The six GaN HEMTs in the three-phase inverter power chip provided by the present disclosure are directly formed on the same substrate 1, which improves the integration rate, and moreover, the layout during the preparation process avoids the increase of the parasitic inductance due to excessive bond wires between the electrodes of the GaN HEMTs, thereby improving the working efficiency of the circuit.

Specifically, the three-phase inverter power chip further includes a P-type semiconductor layer 18 formed between the gate electrode 5 and the potential energy barrier layer 4. The material of the P-type semiconductor layer 18 is P-type gallium nitride, and in the P-type gallium nitride, the P-type doping concentration is $1e16$ $cm^{-3}$ to $1e20$ $cm^{-3}$, and the thickness of the P-type semiconductor layer 18 is 50 nm to 200 nm. Specifically, the thickness of the P-type semiconductor layer 18 may also be 60 nm, 80 nm, 100 nm, 120 nm, 150 nm or 170 nm. It should be noted that the P-type semiconductor layer 18 may also have any other thickness, which is not limited in this embodiment.

The material of the potential energy barrier layer 4 in the three-phase inverter power chip described above is AlGaN. Specifically, the potential energy barrier layer 4 may include Al accounting for 5% to 30%, and the thickness of the potential energy barrier layer 4 is 10 nm to 30 nm. The material of the channel layer 2 is GaN, and the thickness of the channel layer 2 is 50 nm to 500 nm.

The three-phase inverter power chip described above may also include a buffer layer 16 arranged between the substrate 1 and the channel layer 2. The material of the buffer layer 16 is one or more of AlGaN, AlN, and GaN, and the thickness of the buffer layer 16 is 1 μm to 7 μm.

The three-phase inverter power chip described above also includes an AlN layer disposed between the potential energy barrier layer 4 and the channel layer 2, and the thickness of the AlN layer is 1 nm to 5 nm.

The thickness of the ohmic metal layer in the three-phase inverter power chip is 50 nm to 200 nm. Specifically, the thickness of the ohmic metal layer may be 60 nm, 80 nm, 100 nm, 120 nm, 150 nm or 170 nm. The thickness of the gate electrode metal layer may be 50 nm to 200 nm. Specifically, the thickness of the gate electrode metal layer may be 60 nm, 80 nm, 100 nm, 120 nm, 150 nm, or 170 nm. It should be noted that the ohmic metal layer and the gate electrode metal layer may have any other thickness, which is not limited in this embodiment.

In the three-phase inverter power chip described above, the materials of the first dielectric layer 19, the second dielectric layer 20 and the dielectric passivation layer 15 include but are not limited to SiN, $SiO_2$ or a combination thereof.

In yet another embodiment of the present application, a three-phase inverter power chip is also provided. The three-phase inverter power chip includes: a substrate 1, a channel layer 2 provided on one side surface of the substrate 1, a plurality of active areas 31, and an isolation area 17. Each active area 31 includes a potential energy barrier layer 4 and a chip device layer sequentially arranged on the channel layer 2. The chip device layer includes source electrodes 5, drain electrodes 6, gate electrodes 9 and a metal interconnection layer. The metal interconnection layer has a source electrode interconnection metal part corresponding to the source electrode 5, a drain electrode interconnection metal part corresponding to the drain electrode 6, and a gate electrode interconnection metal part corresponding to the gate electrode 9. The plurality of active areas 31 form three active area pairs 3 arranged along the first direction. Each active area pair 3 includes two active areas 31. In each of the active area pairs 31, one active area 3 is configured to form a high-side transistor therein and is named as the first active area, and the other active area 3 is configured to form a low-side transistor therein and is named as the second active area. The isolation area 17 is arranged between the active areas 31 to separate the active areas 31 from each other, and extends from the channel layer 2 towards a side away from the substrate 1. The isolation area 17 is provided with the first bond pad 10, the second bond pads 11 corresponding one-to-one with the active area pairs 3, the third bond pads 12 corresponding one-to-one with the active area pairs 3, and the fourth bond pads 13 corresponding one-to-one with the active areas 31. The drain electrodes 6 in the first active area are electrically connected to the first bond pad 10 by their respective drain electrode interconnection metal parts. The source electrodes 5 in the first active area are electrically connected to the corresponding second bond pads 11 by their respective source electrode interconnection metal parts. The drain electrodes 6 in the second active area are electrically connected to the corresponding second bond pads 11 by their respective drain electrode interconnection metal parts. The source electrodes 5 in the second active area are electrically connected to the corresponding third bond pads 12 by their respective source electrode interconnection metal parts. And the gate electrodes 9 in the active areas 31 are electrically connected to the corresponding fourth bond pads 13 by their respective gate electrode interconnection metal parts.

The six transistors configured to form the three-phase inverter bridge are directly fabricated on one substrate, which achieves the high integration and reduces the difficulty of packaging the three-phase inverter power chip. Moreover, the interconnection metal structure enables the source electrodes, the drain electrodes and the gate electrodes of the transistors to extend to and be electrically connected with the first bond pad 10, the second bond pads 11, the third bond pads 12 or the fourth bond pads 13 corresponding thereto, which replaces the connection mode of connecting the transistors by bond wires in the related technology, thus avoiding the increase of parasitic inductance due to excessive bond wires, reducing the influence of the parasitic parameters on the inverter efficiency effectively, and further improving the working efficiency of the circuit.

Figure 8:
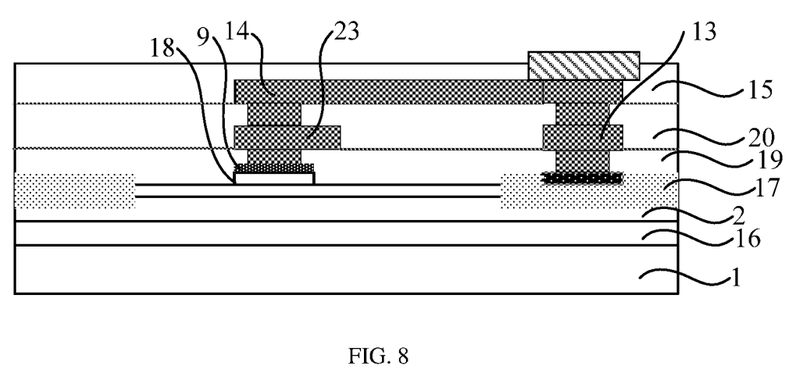
FIG. 8 is a sectional view showing a connection structure of a gate electrode and a corresponding fourth bond pad.

In the three-phase inverter power chip of the present application, the bond pads and the corresponding source electrodes, drain electrodes, and gate electrodes in the active areas may be connected in multiple ways. In an embodiment, as shown in FIG. 8, the first bond pad, the second bond pad, the third bond pad, and the fourth bond pad each include a bond pad interconnection metal part. Each drain electrode in the first active area is electrically connected to the bond pad interconnection metal part of the first bond pad by the respective drain electrode interconnection metal part. Each source electrode in the first active area is electrically connected to the bond pad interconnection metal part of the second bond pad by the respective source electrode interconnection metal part. Each drain electrode in the second active area is electrically connected to the bond pad interconnection metal part of the second bond pad by the respective drain electrode interconnection metal part. Each source electrode in the second active area is electrically connected to the bond pad interconnection metal part of the third bond pad by the respective source electrode interconnection metal part. And the gate electrode in each active area is electrically connected to the bond pad interconnection metal part of the fourth bond pad by the respective gate electrode interconnection metal part.

The bond pads of the present application may be selected to have different bond pad structures according to different connection modes with an external circuit. In an embodiment, the first bond pad, the second bond pad, the third bond pad, and the fourth bond pad each also include a bond pad part, and the bond pad part is arranged on a top surface of the corresponding bond pad interconnection metal part.

In some embodiments, a P-type GaN layer is provided between each gate electrode in the chip device layer and the potential energy barrier layer. In some embodiments, the p-type doping concentration in the P-type GaN layer is 1e16 cm$^{-3}$ to 1e20 cm$^{-3}$. In some embodiments, the thickness of the P-type GaN layer is 50 nm to 200 nm, and the potential energy barrier layer is an AlGaN layer. In some embodiments, the potential energy barrier layer contains Al with a mass content of 5% to 30%. In some embodiments, the thickness of the potential energy barrier layer is 10 nm to 30 nm, and the channel layer is a GaN layer. In some embodiments, the thickness of the channel layer is 50 nm to 500 nm. In some embodiments, an AlN layer is provided between the potential energy barrier layer and the channel layer. In some embodiments, the thickness of the AlN layer is 1 nm to 5 nm. In some embodiments, a buffer layer is provided between the channel layer and the substrate. In some embodiments, the material of the buffer layer is one or more of AlGaN, AlN, and GaN. in some embodiments, the thickness of the buffer layer is 1 μm to 7 μm.

Further, the metal interconnection layer has a source electrode interconnection metal part, a drain electrode interconnection metal part, a gate electrode interconnection metal part, and a dielectric part. The dielectric part is configured to isolate the source electrode interconnection metal part, the drain electrode interconnection metal part, and the gate electrode interconnection metal part from each other, and the material of the dielectric part is SiN, SiO$_2$ or a combination thereof.

The following examples illustrate the preparation method for the three-phase inverter power chip.

After the P-type GaN layer in FIG. 4 is patterned, an ohmic metal layer is formed on a side of the potential energy barrier layer 4 away from the substrate 1. The source electrode 5 and the drain electrode 6 are formed by a patterning process, and then the gate electrode metal layer is formed on a side of the potential energy barrier layer 4 away from the substrate 1, and the gate electrode 9 is formed by a patterning process, thus obtaining the structure shown in FIG. 5.

A first dielectric layer 19 is formed on a side of the source electrode and the isolation area, which is away from the substrate 1, and first through-holes are formed at portions of the first dielectric layer 19, which correspond to the source electrode 5, the drain electrode 6, and the gate electrode 9. First layer bond pad through-holes are formed at the positions where the first bond pad, the second bond pads, the third bond pads and the fourth bond pads are pre-formed in the first dielectric layer of the corresponding isolation area.

A first metal layer is formed on a side of the first dielectric layer 19 away from the substrate 1. The source electrode first metal part 7 is formed in the first through-hole by the first metal layer, which is opposite to the source electrode. The drain electrode first metal part 8 is formed in the first through-hole opposite to the drain electrode. The gate electrode first metal part 23 is formed in the first through-hole opposite to the gate electrode. The first metal part of the first bond pad, the first metal part of the second bond pad, the first metal part of the third bond pad, the first metal part of the fourth bond pad are formed at the positions opposite to the first layer bond pad through-holes respectively. For the formed structure, please refer to FIG. 5 (where a structure above the isolation area is not shown).

The second dielectric layer 20 is formed on the side of the first metal layer away from the substrate 1, and second through-holes are formed at portions of the second dielectric layer 20, which correspond to the first metal part of the first bond pad, the first metal part of the second bond pad, the first metal part of the third bond pad, the first metal part of the fourth bond pad, the source electrode 5, the drain electrode 6, and the gate electrode 9. The second metal layer is formed on a side of the second dielectric layer 20 away from the substrate 1. The second metal layer forms the second metal part of the first bond pad on the first metal part of the first bond pad, forms the second metal part of the second bond pad on the first metal part of the second bond pad, forms the second metal part of the third bond pad on the first metal part of the third bond pad, and forms the second metal part of the fourth bond pad on the first metal part of the fourth bond pad. The source electrode second metal part 21 is formed at the position opposite to the source electrode 5, the drain electrode second metal part 22 is formed at the position opposite to the drain electrode 6, and the gate electrode second metal part 14 is formed at the position opposite to the gate electrode 9. For the formed structure, please refer to FIG. 6 (where the structure above the isolation area is not shown).

The source electrode first metal part and the source electrode second metal part each are part of the source electrode interconnection metal part, the drain electrode first metal part and the drain electrode second metal part each are part of the drain electrode interconnection metal part, and the gate electrode first metal part and the gate electrode second metal part each are part of the gate electrode interconnection metal part. The first metal part and second metal part of the first bond pad each are part of the first bond pad, the first metal part and second metal part of the second bond pad each are part of the second bond pad, the first metal part and second metal part of the third bond pad each are part of the third bond pad, and the first metal part and second metal part of the fourth bond pad each are part of the fourth bond pad.

If the second metal layer is not the top metal layer, the above process is repeated till the top metal layer is prepared. After the top metal layer is prepared, a dielectric passivation layer is deposited to cover the top metal layer. During the preparation of the top metal layer, by means of a patterning process, the drain electrodes in the first active area are electrically connected to the bond pad interconnection metal parts of the first bond pads respectively by their respective drain electrode interconnection metal parts. The source electrodes in the first active area are electrically connected to the bond pad interconnection metal parts of the second bond pads respectively by their respective source electrode interconnection metal parts. The drain electrodes in the second active area are electrically connected to the bond pad interconnection metal parts of the second bond pads respectively by their respective drain electrode interconnection metal parts. The source electrodes in the second active area are electrically connected to the bond pad interconnection metal parts of the third bond pads respectively by their respective source electrode interconnection metal parts. The gate electrodes in the active areas are electrically connected to the bond pad interconnection metal parts of the fourth bond pads respectively by their respective gate electrode interconnection metal parts. FIG. 8 is a sectional view showing a connection structure of a gate electrode and a corresponding fourth bond pad, and the connection modes of other interconnection metal parts and the corresponding bond pads are not illustrated one by one. Those skilled in the art may implement the corresponding patterning process for the interconnection metal part by referring to FIG. 8, so as to realize the connection.

Obviously, for those skilled in the art, various changes and modifications may be made for the embodiments of the present disclosure without departing from the spirit and scope of the present disclosure. In this way, if these changes and modifications of the present disclosure fall within the scope of the claims of the present disclosure and the scope of the equivalent technologies, the present disclosure is also intended to include these changes and modifications.

What is claimed is:

1. A preparation method for a three-phase inverter power chip, comprising:
    forming a channel layer and a potential energy barrier layer on a side surface of a substrate in sequence;
    forming three active area pairs on the channel layer and the potential energy barrier layer along a first direction by an isolation process;
    each of the three active area pairs comprising two active areas, wherein, among the two active areas comprised in each of the active area pairs, one active area is configured to form a high-side transistor therein, and the other active area is configured to form a low-side transistor therein;
    forming an isolation area outside the active areas, and at a side of the channel layer and of the potential energy barrier layer away from the substrate;
    forming a chip device layer on the potential energy barrier layer;
    each portion of the chip device layer corresponding to each of the active areas comprising a source electrode, a drain electrode, and a gate electrode, and another portion of the chip device layer corresponding to the isolation area comprising a first bond pad, second bond pads configured to correspond one-to-one with the three active area pairs, third bond pads configured to correspond one-to-one with the three active area pairs, and fourth bond pads configured to correspond one-to-one with the active areas;
    in each group of the three active area pairs, the first bond pad, the second bond pads the third bond pads, and the fourth bond pads, which correspond to each other, electrically connecting the drain electrode arranged in each of the active areas, configured to form the high-side transistor, to the first bond pad,
    electrically connecting the source electrode arranged in each of the active areas, configured to form the high-side transistor, to each of the second bond pads, respectively,
    electrically connecting the drain electrode arranged in each of the active areas, configured to form the low-side transistor, to each of the second bond pads, respectively,
    electrically connecting the source electrode arranged in each of the active areas configured to form the low-side transistor, to each of the third bond pads, respectively, and electrically connecting the gate electrode arranged in each of the active areas to each of the fourth bond pads, respectively;

forming a dielectric passivation layer on the chip device layer; and etching the dielectric passivation layer, and exposing the first bond pad, the second bond pads, the third bond pads, and the fourth bond pads.

2. The preparation method according to claim 1, wherein the forming a chip device layer on the potential energy barrier layer comprises:

forming an ohmic metal layer on a side of the potential energy barrier layer away from the substrate, and the source electrode and the drain electrode are formed by a patterning process;

forming a gate electrode metal layer on the side of the potential energy barrier layer away from the substrate, and forming the gate electrode by the patterning process;

forming a first dielectric layer on a side of the source electrode, the drain electrode and the gate electrode, the side being away from the substrate, and forming first through-holes at portions of the first dielectric layer, the portions of the first dielectric layer corresponding to the source electrode, the drain electrode, and the gate electrode;

forming a first metal layer on a side of the first dielectric layer away from the substrate;

portions of the first metal layer, which are opposite to the first through-holes, sinking into the first through-holes;

forming a first metal part of the first bond pad, a first metal part of the second bond pad, a first metal part of the third bond pad, and a first metal part of the fourth bond pad in the isolation area by the first metal layer through the patterning process;

forming a source electrode first metal part at a position opposite to the source electrode, to connect the source electrode and the first metal part of the second bond pad or the first metal part of the third bond pad;

forming a drain electrode first metal part at a position opposite to the drain electrode, to connect the drain electrode and the first metal part of the first bond pad or the first metal part of the second bond pad;

forming a gate electrode first metal part at a position opposite to the gate electrode;

forming a second dielectric layer on a side of the first metal layer away from the substrate;

forming second through-holes at portions of the second dielectric layer, wherein the portions of the second dielectric layer correspond to the first metal part of the first bond pad, the first metal part of the second bond pad, the first metal part of the third bond pad, the first metal part of the fourth bond pad, the source electrode, the drain electrode, and the gate electrode;

forming a second metal layer on a side of the second dielectric layer away from the substrate;

portions of the second metal layer, which are opposite to the second through-holes, sinking into the second through-holes;

forming a second metal part of the first bond pad, a second metal part of the second bond pad, a second metal part of the third bond pad, and a second metal part of the fourth bond pad in the isolation area by the second metal layer through the patterning process;

forming a source electrode second metal part at a position opposite to the source electrode;

forming a drain electrode second metal part at a position opposite to the drain electrode; and forming a gate electrode second metal part at a position opposite to the gate electrode, to connect the gate electrode first metal part and the second metal part of the fourth bond pad.

3. The preparation method according to claim 1, wherein the forming a chip device layer on the potential energy barrier layer comprises:

forming an ohmic metal layer on a side of the potential energy barrier layer away from the substrate, and forming the source electrode and the drain electrode by a patterning process;

forming a gate electrode metal layer on the side of the potential energy barrier layer away from the substrate, and forming the gate electrode by the patterning process;

forming a first dielectric layer on a side of the source electrode, the drain electrode and the gate electrode away from substrate;

forming first through-holes at portions of the first dielectric layer, the portions of the first dielectric layer corresponding to the source electrode, the drain electrode and the gate electrode;

forming a first metal layer on a side of the first dielectric layer away from the substrate;

portions of the first metal layer, which are opposite to the first through-holes, sinking into the first through-holes;

forming a first metal part of the first bond pad, a first metal part of the second bond pad, a first metal part of the third bond pad, and a first metal part of the fourth bond pad in the isolation area by the first metal layer through the patterning process;

forming a source electrode first metal part at a position opposite to the source electrode;

forming a drain electrode first metal part at a position opposite to the drain electrode; and forming a gate electrode first metal part at a position opposite to the gate electrode, to connect the gate electrode and the first metal part of the fourth bond pad;

forming a second dielectric layer on a side of the first metal layer away from the substrate;

forming second through-holes at portions of the second dielectric layer, wherein the portions of the second dielectric layer correspond to the first metal part of the first bond pad, the first metal part of the second bond pad, the first metal part of the third bond pad, the first metal part of the fourth bond pad, the source electrode, the drain electrode and the gate electrode;

forming a second metal layer on a side of the second dielectric layer away from the substrate;

portions of the second metal layer, which are opposite to the second through-holes, sinking into the second through-holes, respectively;

forming a second metal part of the first bond pad, a second metal part of the second bond pad, a second metal part of the third bond pad and a second metal part of the fourth bond pad in the isolation area by the second metal layer through the patterning process;

forming a source electrode second metal part at a position opposite to the source electrode, to connect the source electrode first metal part and the second metal part of the second bond pad or the second metal part of the third bond pad;

forming a drain electrode second metal part at a position opposite to the drain electrode, to connect the drain electrode first metal part and the second metal part of the first bond pad or the second metal part of the second bond pad; and forming a gate electrode second metal part at a position opposite to the gate electrode.

4. The preparation method according to claim 1, wherein the isolation process comprises a mesa etching process, and an etching depth is 100 nm to 500 nm.

5. The preparation method according to claim 1, wherein the isolation process comprises an ion implantation process, and an ion implantation depth is 100 nm to 500 nm.

6. A three-phase inverter power chip, comprising:
a substrate;
a channel layer and a potential energy barrier layer formed on a side surface of the substrate in sequence, three active area pairs being formed on the channel layer and the potential energy barrier layer along a first direction, each of the three active area pairs comprising two active areas arranged in a direction perpendicular to the first direction, wherein, among the two active areas in each of the three active area pairs, one active area is configured to form a high-side transistor therein, and the other active area is configured to form a low-side transistor therein;
an isolation region, formed outside the active areas and formed at a side of the channel layer and the potential energy barrier layer away from the substrate;
a chip device layer formed on a side of the potential energy barrier layer away from the channel layer, wherein: each portion of the chip device layer, which is corresponding to each of the active areas, comprises a source electrode, a drain electrode, and a gate electrode; another portion of the chip device layer corresponding to the isolation area comprises a first bond pad, second bond pads configured to correspond one-to-one with the active area pairs, third bond pads configured to correspond one-to-one with the active area pairs, and fourth bond pads configured to correspond one-to-one with the active areas; in the active area pairs, the drain electrodes in the active areas configured to form high-side transistors respectively are electrically connected to the first bond pad; in the active area pairs, the source electrodes arranged in the active areas configured to form high-side transistors are electrically connected to the second bond pads corresponding one-to-one with the active area pairs, respectively; in the active area pairs, the drain electrodes arranged in the active areas configured to form low-side transistors are electrically connected to the second bond pads corresponding one-to-one with the active area pairs, respectively; in each the active area pairs, the source electrodes arranged in the active area configured to form the low-side transistors are electrically connected to the third bond pads corresponding one-to-one with the active area pairs, respectively; and in the active area pairs, the gate electrodes arranged in the active areas are electrically connected to the fourth bond pads corresponding one-to-one with the active areas, respectively; and the dielectric passivation layer formed on a side of the chip device layer away from the substrate, wherein portions of the dielectric passivation layer, which are opposite to the first bond pad, the second bond pads, the third bond pads, and the fourth bond pads, are respectively etched to expose the first bond pad, the second bond pads, the third bond pads and the fourth bond pads.

7. The three-phase inverter power chip according to claim 6, wherein materials of the first dielectric layer, the second dielectric layer and the dielectric passivation layer are SiN, $SiO_2$, or a combination thereof.

8. A three-phase inverter power chip, comprising:
a substrate;
a channel layer provided on one side surface of the substrate;
a plurality of active areas, each of the plurality of active areas comprising a potential energy barrier layer and a chip device layer sequentially arranged on the channel layer, wherein: the chip device layer comprises source electrodes, drain electrodes, gate electrodes and a metal interconnection layer; the metal interconnection layer has a source electrode interconnection metal part corresponding to each of the source electrodes, a drain electrode interconnection metal part corresponding to each of the drain electrodes, and a gate electrode interconnection metal part corresponding to each of the gate electrodes; the plurality of active areas form three active area pairs arranged along a first direction; each of the three active area pairs comprises two active areas; in each of the active area pairs, one active area is configured to form a high-side transistor therein and is named as a first active area, and the other active area is configured to form a low-side transistor therein and is named as a second active area;

an isolation area, arranged between the active areas to separate the active areas from each other, and extending from the channel layer towards a side away from the substrate, wherein: the isolation area is provided with a first bond pad, second bond pads corresponding one-to-one with the three active area pairs, third bond pads corresponding one-to-one with the three active area pairs, and fourth bond pads corresponding one-to-one with the active areas; the drain electrodes in the first active area are electrically connected to the first bond pad by respective drain electrode interconnection metal parts thereof; the source electrodes in the first active area are electrically connected to corresponding the second bond pads by respective source electrode interconnection metal parts thereof; the drain electrodes in the second active area are electrically connected to corresponding the second bond pads by respective drain electrode interconnection metal parts thereof; the source electrodes in the second active area are electrically connected to corresponding the third bond pads by respective source electrode interconnection metal parts thereof; and the gate electrodes in the active areas are electrically connected to corresponding the fourth bond pads by respective gate electrode interconnection metal parts thereof.

9. The three-phase inverter power chip according to claim 8, wherein:
the first bond pad, the second bond pad, the third bond pad, and the fourth bond pad each comprise a bond pad interconnection metal part;
each drain electrode in the first active area is electrically connected to the bond pad interconnection metal part of the first bond pad by a respective drain electrode interconnection metal part;
each source electrode in the first active area is electrically connected to the bond pad interconnection metal part of the second bond pad by a respective source electrode interconnection metal part;
each drain electrode in the second active area is electrically connected to the bond pad interconnection metal part of the second bond pad by the respective drain electrode interconnection metal part;

each source electrode in the second active area is electrically connected to the bond pad interconnection metal part of the third bond pad by the respective source electrode interconnection metal part; and a gate electrode in each active area is electrically connected to the bond pad interconnection metal part of the fourth bond pad by the respective gate electrode interconnection metal part.

10. The three-phase inverter power chip according to claim 9, wherein the first bond pad, the second bond pad, the third bond pad, and the fourth bond pad each further comprise a bond pad part, and the bond pad part is arranged on a top surface of a corresponding bond pad interconnection metal part.

11. The three-phase inverter power chip according to claim 8, wherein:
a P-type GaN layer is provided between each gate electrode in the chip device layer and the potential energy barrier layer.

12. The three-phase inverter power chip according to claim 8, wherein:
the metal interconnection layer has the source electrode interconnection metal part, the drain electrode interconnection metal part, the gate electrode interconnection metal part, and a dielectric part;
the dielectric part is configured to isolate the source electrode interconnection metal part, the drain electrode interconnection metal part, and the gate electrode interconnection metal part from each other; and
a material of the dielectric part is SiN, SiO$_2$ or a combination thereof.

13. The three-phase inverter power chip according to claim 11, wherein:
a p-type doping concentration in the P-type GaN layer is 1e16 cm$^{-3}$ to 1e20 cm$^{-3}$.

14. The three-phase inverter power chip according to claim 11, wherein:
a thickness of the P-type GaN layer is 50 nm to 200 nm, and the potential energy barrier layer is an AlGaN layer.

15. The three-phase inverter power chip according to claim 8, wherein:
the potential energy barrier layer contains Al with a mass content of 5% to 30%.

16. The three-phase inverter power chip according to claim 8, wherein:
a thickness of the potential energy barrier layer is 10 nm to 30 nm, and the channel layer is a GaN layer.

17. The three-phase inverter power chip according to claim 8, wherein:
a thickness of the channel layer is 50 nm to 500 nm.

18. The three-phase inverter power chip according to claim 8, wherein:
an AlN layer is provided between the potential energy barrier layer and the channel layer.

19. The three-phase inverter power chip according to claim 18, wherein:
a thickness of the AlN layer is 1 nm to 5 nm.

20. The three-phase inverter power chip according to claim 11, wherein:
a buffer layer is provided between the channel layer and the substrate;
a material of the buffer layer is one or more of AlGaN, AlN, and GaN; and
a thickness of the buffer layer is 1 μm to 7 μm.

* * * * *